United States Patent
Chan et al.

(10) Patent No.: US 9,171,849 B2
(45) Date of Patent: Oct. 27, 2015

(54) THREE DIMENSIONAL DUAL-PORT BIT CELL AND METHOD OF USING SAME

(71) Applicant: Taiwan Semiconductor Manufacturing Co., Ltd., Hsin-Chu (TW)

(72) Inventors: Wei Min Chan, Sindian (TW); Wei-Cheng Wu, Hsinchu (TW); Yen-Huei Chen, Jhudong Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 45 days.

(21) Appl. No.: 14/032,222

(22) Filed: Sep. 20, 2013

(65) Prior Publication Data

US 2015/0085556 A1  Mar. 26, 2015

(51) Int. Cl.
*G11C 5/06* (2006.01)
*H01L 27/11* (2006.01)
*G11C 11/412* (2006.01)
*G11C 11/413* (2006.01)
*G11C 8/16* (2006.01)
*H01L 27/06* (2006.01)
*G11C 5/02* (2006.01)
*G11C 8/08* (2006.01)

(52) U.S. Cl.
CPC ............ *H01L 27/1104* (2013.01); *G11C 5/025* (2013.01); *G11C 8/08* (2013.01); *G11C 8/16* (2013.01); *G11C 11/412* (2013.01); *G11C 11/413* (2013.01); *H01L 27/0688* (2013.01); *H01L 2224/48227* (2013.01); *H01L 2224/73265* (2013.01)

(58) Field of Classification Search
CPC ........... H01L 2224/48227; H01L 2224/73265; H01L 21/8221; H01L 27/1116; G11C 11/413
USPC ........... 365/63, 129, 154, 156, 174, 177, 188, 365/190, 72
See application file for complete search history.

(56) References Cited

U.S. PATENT DOCUMENTS

| | | | |
|---|---|---|---|
| 2008/0123462 A1* | 5/2008 | Liaw | 365/230.05 |
| 2010/0006942 A1* | 1/2010 | Park et al. | 257/350 |
| 2015/0001635 A1* | 1/2015 | Kwon et al. | 257/379 |
| 2015/0009750 A1* | 1/2015 | Schaefer et al. | 365/156 |

* cited by examiner

*Primary Examiner* — Fernando Hidalgo
(74) *Attorney, Agent, or Firm* — Duane Morris LLP

(57) ABSTRACT

A three dimensional dual-port bit cell generally comprises a first portion disposed on a first tier, wherein the first portion includes a plurality of port elements. The dual-port bit cell also includes a second portion disposed on a second tier that is vertically stacked with respect to the first tier using at least one via, wherein the second portion includes a latch.

19 Claims, 5 Drawing Sheets

THREE DIMENSIONAL DUAL-PORT BIT CELL AND METHOD OF USING SAME

FIELD OF DISCLOSURE

The disclosed systems and methods relate to static random access memory ("SRAM") arrays and, more particularly, to a dual-port bit cell that can be used with SRAM arrays.

BACKGROUND

Static random access memories ("SRAM") include a plurality of cells disposed in rows and columns to form an array. SRAM cells include a plurality of transistors coupled to bit lines and word lines that are used to read and write a bit of data to the memory cell. Single-port SRAMs enable a single bit of data to be written to or read from a bit cell at a particular time. In contrast, a dual-port SRAMs enables multiple reads or writes to occur at approximately the same time. Conventional dual-port SRAM structures include word lines ("WLs") in different metal lines, which causes different capacitive loading due to the different metal length being used to route signals of the SRAM. Dual-port SRAM structures are larger and wider in the WL direction than a single-port SRAM structure. Due to the larger and wider WL direction for the dual-port SRAM, the aspect ratio of an SRAM macro can be impacted during heavy WL loading, especially for wide input/output ("I/O") designs. When compared with a single-port SRAM, the periphery logic circuitry of the dual-port SRAM is doubled. As such, dual-port SRAMs can occupy a larger area, and signal routing complexities can occur.

DETAILED DESCRIPTION

This description of the exemplary embodiments is intended to be read in connection with the accompanying drawings, which are to be considered part of the entire written description.

Some embodiments of the three dimensional dual-port bit cell described herein have a configuration and design that facilitates a reduction in footprint area, while improving overall cell performance and inhibiting signal routing complexities for the corresponding SRAM array in which the cell is used. For example, in some embodiments, the three-dimensional dual-port cell is configured such that port elements or components are disposed on a top tier or layer and latch elements or components are disposed on a bottom tier or layer. Not only does this configuration facilitate a footprint area reduction, but word line ("WL") parasitic resistance and capacitance is also reduced, thereby improving the overall performance of the cell. Also, by having the port elements on the top tier or layer and the latch elements on the bottom tier or layer, power routing and signal routing is separated between the two tiers or layers. Because the power and signal routings are separated, signal routing complexities, such as signal blocks or jams, can be inhibited.

Figure 1:
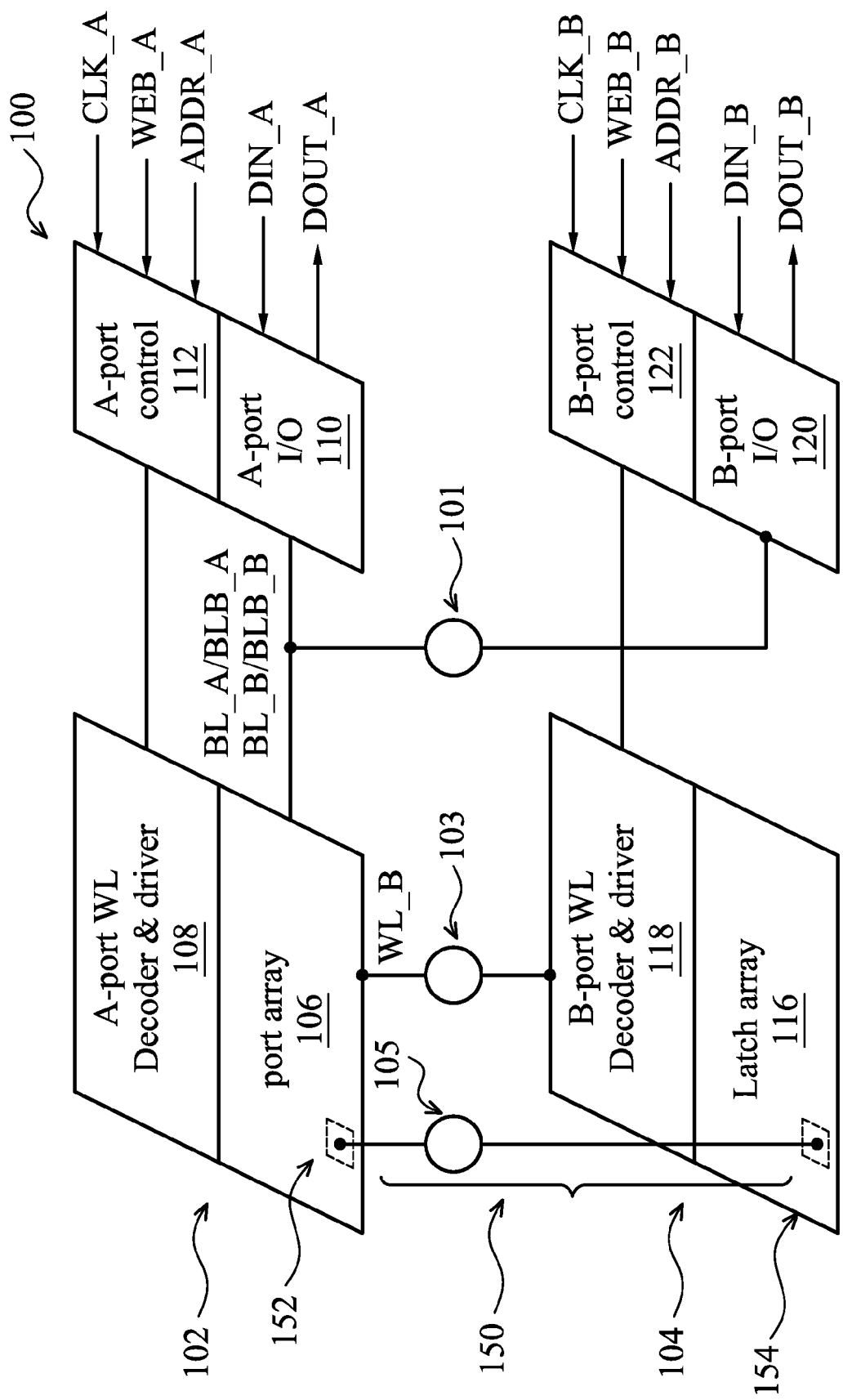
FIG. 1 is an electrical diagram of an embodiment of a semi-conductor memory array.
Figure 2:
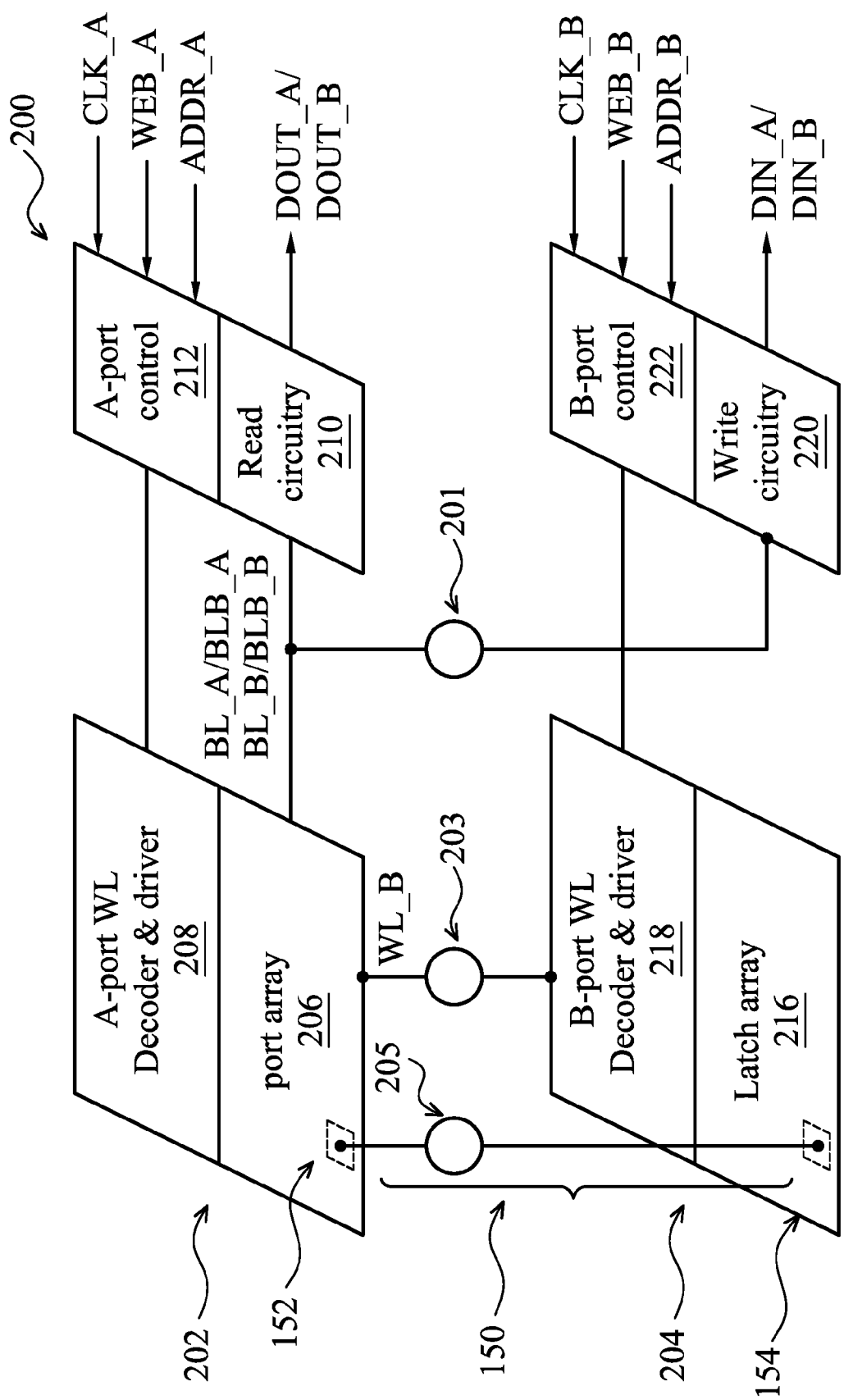
FIG. 2 is an electrical diagram of an alternative embodiment of a semi-conductor memory array.

FIG. 1 illustrates one example of an SRAM macro 100. FIG. 2 illustrates an alternative embodiment of an SRAM macro 200 that can be used in place of SRAM macro 100. Referring to FIG. 1, in some embodiments, the SRAM macro 100 is included in a three-dimensional integrated circuit (3D IC) having a stacked die configuration. SRAM macro 100 includes an upper device layer 102 that is implemented in a first IC die, and a bottom device layer 104 is implemented in a second IC die. The top IC die has through substrate vias (TSV) allowing connections between circuitry on the top face of the top die and contacts on the top face of the bottom die.

In other embodiments, SRAM macro 100 is included in a monolithic 3D IC structure, having a two or more "tiers" where each tier has a respective active device layer and a respective interconnect structure. In a monolithic 3D IC structure, the bottom layer 104 of the SRAM cell is formed on a semiconductor substrate, and the interconnect structure of the bottom layer 104 is fabricated. An additional ILD layer is formed above the interconnect structure of the first tier. The upper layer 102 of the cell is provided in a second active device tier above the additional ILD layer. As shown in the figures, the bit lines ("BLs") extend in a first direction in a conductive layer of the first tier, and the word lines ("WLs") extend in a second direction in a second conductive layer of the first tier, wherein the first direction is different from the second direction.

In some embodiments, top layer 102 that includes the A-port. Top layer 102 is stacked on top of and connected to bottom layer 104 with vias 101, 103, and 105. The bottom layer 104 includes the B-port. As such, in some embodiments, the input/output ("I/O") circuitry for the A-port and the B-port are disposed on two separate conductive layers. For example, in some embodiments, top layer 102 includes port elements, such as an access port array portion 106 and an A-port WL decoder and driver portion 108. In some embodiments, access port array portion 106 is coupled to an A-port I/O circuit 110 with BLs therebetween, such as BL_A and its complement BLB_A and BL_B and its complement BLB_B. In some embodiments, A-port I/O circuit 110 is configured to receive data input signals, such as DIN_A, and to transmit data output signals, such as DOUT_A, out of SRAM 100.

It should be noted that, as used herein, the term "couple" is not limited to a direct mechanical, thermal, communication, and/or an electrical connection between components, but may also include an indirect mechanical, thermal, communication and/or electrical connection between multiple components As used herein, the term "circuit" refers generally to any programmable system including systems and microcontrollers, reduced instruction set circuits ("RISC"), application specific integrated circuits ("ASIC"), programmable logic circuits ("PLC"), and any other circuit capable of executing the functions described herein. The above examples are exemplary only, and thus are not intended to limit in any way the definition and/or meaning of the term "circuit."

In some embodiments, A-port WL decoder and driver portion 108 is coupled to an A-port control circuit 112. A-port control circuit 112 is configured to receive a clock signal of the A-port, such as CLK_A, and a write enable signal (negative enable), such as WEB_A. A-port control circuit 112 is also configured to receive address signals, such as ADDR_A.

Bottom layer 104 includes a latch array portion 116 and a B-port WL decoder and driver portion 118. In some embodiments, latch array portion 116 is indirectly coupled to a B-port I/O circuit 120 that is configured to receive data input signals, such as DIN_B, and to transmit data output signals, such as DOUT_B, out of macro 100. In some embodiments, B-port WL decoder and driver portion 118 is coupled to an B-port control circuit 122 that is configured to receive a clock signal of the B-port, such as CLK_B, and a write enable signal (negative enable), such as WEB_B. B-port control circuit 122 is also configured to receive address signals, such as ADDR_B.

In some embodiments, rather than having the I/O circuitry for the A-port and the B-port be disposed on two separate conductive layers, the I/O circuitry can be separated into read and write circuitry that are each disposed on separate conductive layers. For example, referring to FIG. 2, SRAM macro 200, which can be used in place of SRAM macro 100, includes a top layer 202 that is stacked on top of and connected to a bottom layer 204 with vias 201, 203, and 205. In some embodiments, top layer 202 includes the A port and, therefore, includes an access port array portion 206 and an A-port WL decoder and driver portion 208. In some embodiments, access port array portion 206 is coupled to a read circuitry 210 with BLs therebetween, such as BL_A and its complement BLB_A and BL_B and its complement BLB_B. In some embodiments, read circuitry 210 is configured to transmit data output signals of the A and B ports, such as DOUT_A and DOUT_B, out of SRAM macro 200.

In some embodiments, A-port WL decoder and driver portion 208 is coupled to an A-port control circuit 212. A-port control circuit 212 is configured to receive a clock signal of the A-port, such as CLK_A, and a write enable signal (negative enable), such as WEB_A. A-port control circuit 212 is also configured to receive address signals, such as ADDR_A.

Bottom layer 204 includes the B port and, therefore, includes a latch array portion 216 and a B-port WL decoder and driver portion 218. In some embodiments, latch array portion 216 is indirectly coupled to a write circuitry 220 that is configured to receive data input signals of the A and B ports, such as DIN_A and DIN_B, for SRAM macro 200. In some embodiments, B-port WL decoder and driver portion 218 is coupled to a B-port control circuit 222 that is configured to receive a clock signal of the B-port, such as CLK_B, and a write enable signal (negative enable), such as WEB_B. A-port control circuit 222 is also configured to receive address signals, such as ADDR_B.

Referring to both FIGS. 1 and 2, each SRAM macro 100 and SRAM macro 200 include at least one three-dimension dual-port bit cell 150 that includes a first portion 152 that is disposed on the top layer 102 or 202 of the respective SRAM macro 100 or 200. For example, first portion 152 is disposed on at least a portion of access port array portion 106 or access port array portion 206. Dual-port bit cell 150 also includes a second portion 154 that is disposed on the bottom layer 104 or 204 of the respective SRAM macro 100 or 200. For example, second portion 154 is disposed on at least a portion of latch array portion 116 or of latch array portion 216. As will be explained in more detail below with respect to FIGS. 3-5, dual-port bit cell 150 has a configuration and design that facilitates a reduction in footprint area while improving overall cell performance and inhibiting signal routing complexities for the corresponding SRAM macro 100 (or SRAM array 106 116) or SRAM macro 200 (or SRAM array 206 216) with which that cell 150 is used.

Figure 3:
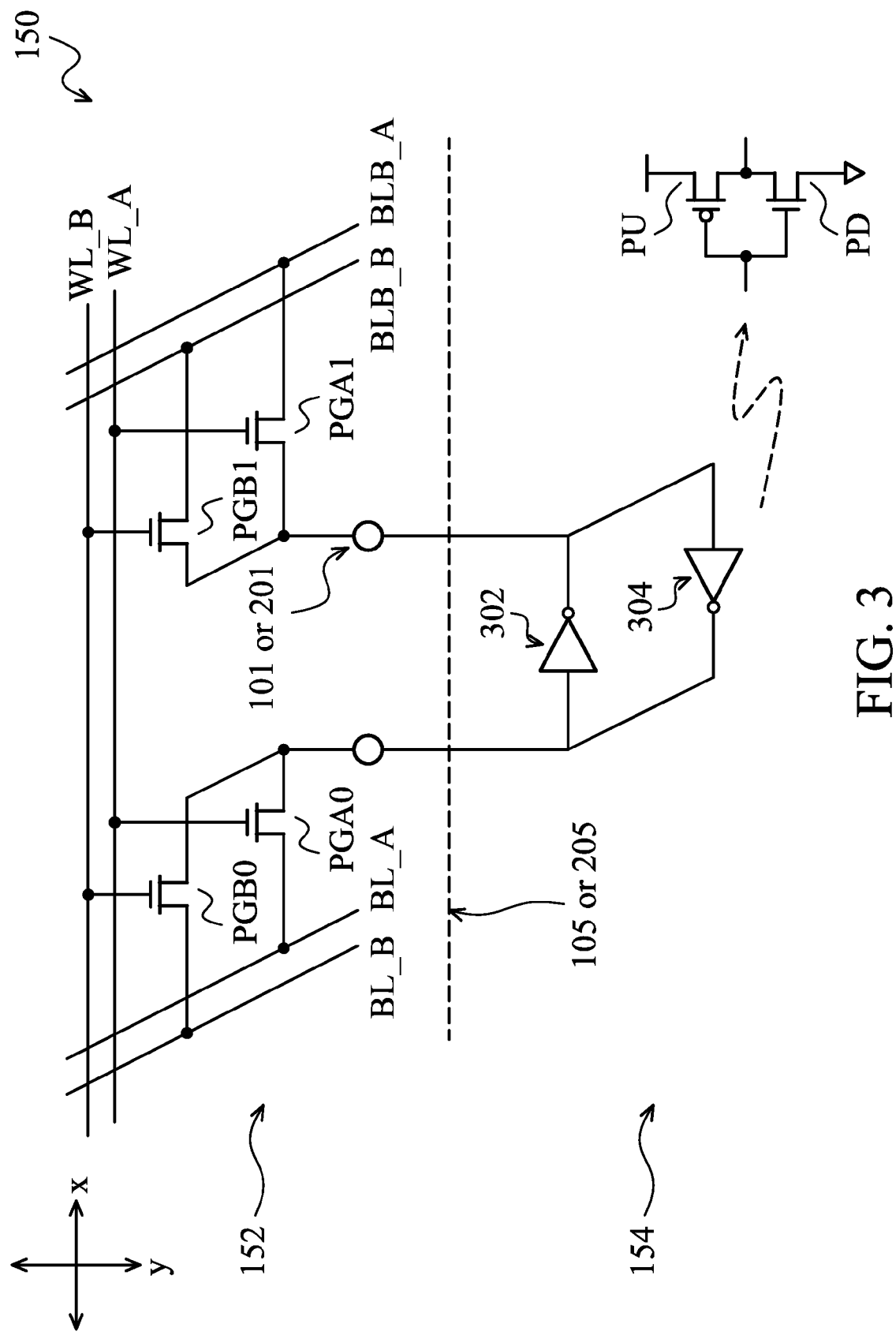
FIG. 3 is an electrical diagram of an embodiment of a three dimensional dual-port bit cell that is used with the semi-conductor memory array shown in FIG. 1 or used with the alternative semi-conductor memory array shown in FIG. 2.
Figure 4:
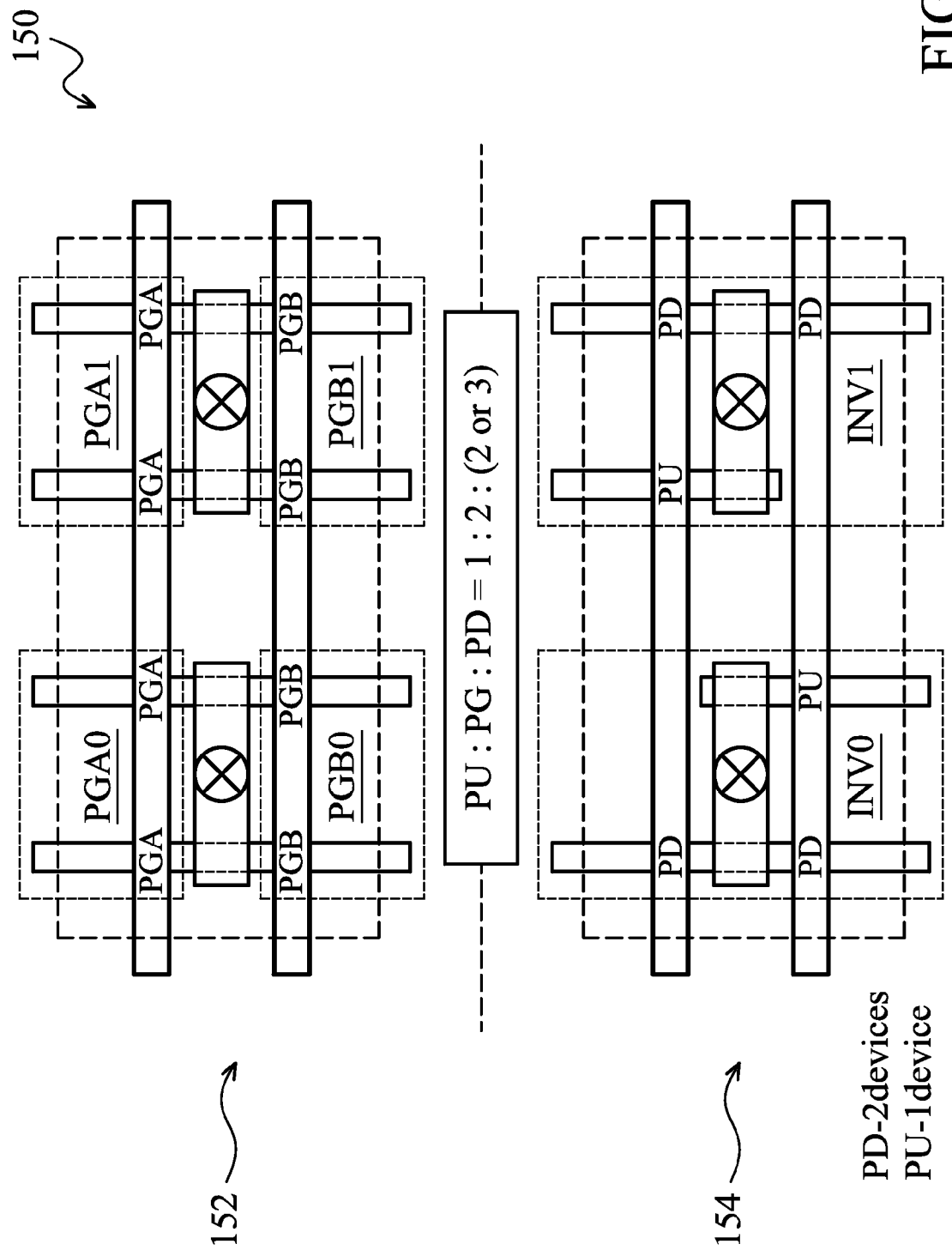
FIG. 4 is a block diagram of the three dimensional dual-port bit cell shown in FIG. 3.
Figure 5:
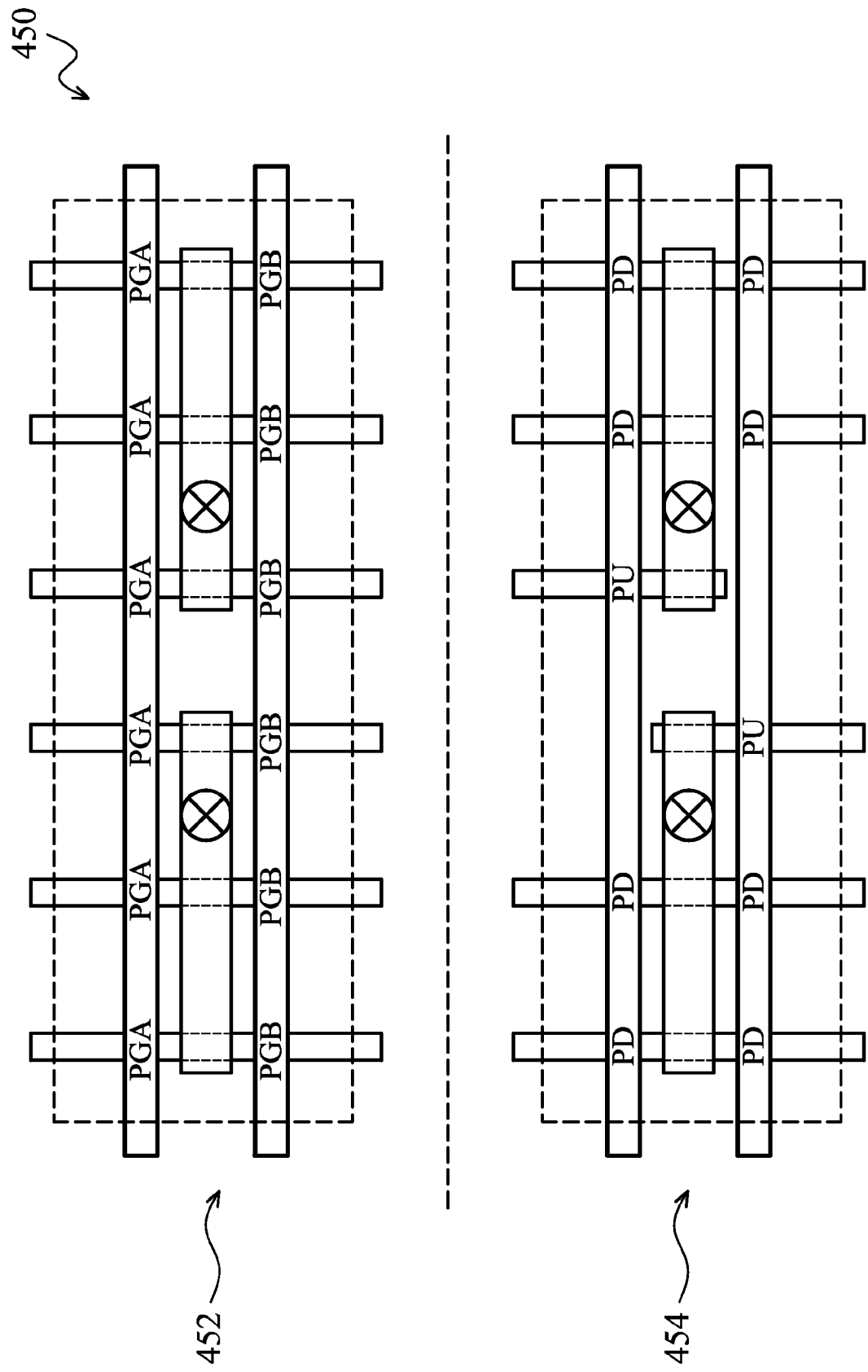
FIG. 5 is a block diagram of an alternative embodiment of a three-dimensional dual-port bit cell.

FIG. 3 is an electrical diagram of one example of a dual-port bit cell 150 in accordance with some embodiments. FIG. 4 is a layout diagram of dual-port bit cell 150. FIG. 5 is an alternative dual-port bit cell 450 that may be used in place of dual-port bit cell 150. Referring to FIGS. 3 and 4, dual-port bit cell 150 is a high density dual-port bit cell and, as discussed above, first portion 152 of cell 150 is disposed on the top layer 102 (shown in FIG. 1) of SRAM array 100 (shown in FIG. 1) or on the top layer (shown in FIG. 2) 202 of SRAM array 200 (shown in FIG. 2). For example, first portion 152 is disposed on at least a portion of access port array portion 106 (shown in FIG. 1) or on at least a portion of access port array portion 206 (shown in FIG. 2). Therefore, first portion 152 includes the access port elements. Second portion 154 of bit cell 150 is disposed on the bottom layer 104 (shown in FIG. 1) of SRAM macro 100 or on the bottom layer 204 (shown in FIG. 2) of SRAM macro 200. For example, second portion 154 is disposed on at least a portion of latch array portion 116 (shown in FIG. 1) or on at least a portion of latch array portion 216 (shown in FIG. 2) and, therefore, second portion 154 includes the latch or latch elements.

In some embodiments, first portion 152 includes at least one pair of WLs, WL_A and WL_B, that extend horizontally (i.e., in an x-direction) across first conductive layer 102 or across second conductive layer 202. First portion 152 also includes at least one pair of complementary BLs that extend vertically (i.e., in a y-direction) across first conductive layer 102 or across first conductive layer 202 (i.e., in a y-direction). For example, first portion 152 can include two pairs of complementary BLs, such as BL_B, BL_A, BLB_B, and BLB_A. In some embodiments, first portion 152 also includes access port elements that include at least two complementary pass-gate (PG) transistor devices, such as two PGA transistor devices and two PGB transistor devices, that are coupled to the WLs and to the BLs. In some embodiments, PG transistor devices are NMOS devices.

In some embodiments, second portion 154 includes latch or latch elements that include at least two devices, such as a first inverter 302 and a second inverter 304. Each inverter 302 and 304 includes at least one pull-up (PU) transistor device and least two pull-down (PD) transistor devices. For example, as shown in FIG. 4, for every two PG transistor devices, there is one PU transistor device and two PD transistor devices. In some embodiments, the PU transistor devices are PMOS devices and the PD transistor devices are NMOs devices. First portion 152 can have any number of PG transistor devices and second portion 154 can have any number of PU and PD transistor devices so long as the ratio is 2 PG transistor devices: 1 PU transistor device: 2 to 3 PD transistor devices.

Alternatively, if a different type of dual-port bit cell is being used, the ratio can be different. For example, referring to FIG. 5, dual-port bit cell 450, which is a high current dual-port bit cell, may be used in place of dual-port bit cell 150. As shown in FIG. 5, first portion 452 of cell 450 is disposed on the top layer 102 of SRAM macro 100 or top layer 202 of SRAM macro 200. For example, first portion 452 is disposed on at least a portion of access port array portion 106 or on at least a portion of access port array portion 206. Second portion 454 of bit cell 450 is disposed on the bottom layer 104 of SRAM macro 100 or bottom layer 204 of SRAM macro 200. For example, second portion 454 is disposed on at least a portion of latch array portion 116 or on at least a portion of latch array portion 216.

In some embodiments, first portion 452 includes three PG transistor devices, such as three PGA transistor devices and three PGB transistor devices. In some embodiments, PG transistor devices are NMOS devices. In some embodiments, as shown in FIG. 5, for every three PG transistor devices, there is one PU transistor device and four PD transistor devices. In some embodiments, the PU transistor devices are PMOS devices and the PD transistor devices are NMOs devices. First portion 452 can have any number of PG transistor devices and second portion 454 can have any number of PU and PD transistor devices so long as the ratio is 3 PG transistor devices: 1 PU transistor device: 4 to 5 PD transistor devices.

Referring to FIGS. 3, 4, and 5, when using the described configurations for dual-port bit cell 150 or dual port cell 450, the access port elements are disposed on first conductive layer 102 of SRAM macro 100 or on first conducive layer 202 of SRAM macro 200 and the latch elements are disposed on second layer 104 of SRAM macro 100 or on second layer 204 of SRAM macro 200. Such a design and configuration facilitates a cell footprint reduction and a total cell area reduction. For example, in some embodiments, the cell footprint reduction is approximately 53% and the total cell area reduction is approximately 6%. In some embodiments, when comparing the cell footprint of a two-dimensional high current dual-port cell with a three-dimensional high current dual port cell, such as cell 450, the ratio is 1:0.47.

The configurations for dual-port bit cell 150 and dual port cell 450 also facilitate a macro footprint reduction and a total macro area reduction. For example, in some embodiments, the macro footprint reduction is approximately 59%, and the total macro area reduction is approximately 19%. In some embodiments, such a configuration facilitates a 75% cell efficiency for cell 450. In some embodiments, when comparing the macro footprint of a two-dimensional high current dual-port cell with a three-dimensional high current dual port cell, such as cell 450, the ratio is 1:0.41.

Because the configurations for dual-port bit cell 150 and dual-port bit cell 450 have the port elements on first conductive layer 102 or 202 and the latch elements on second layer 104 or 204, WL parasitic resistance and capacitance is reduced. As such, the overall performance of the dual-port bit cell 150 and the dual-port bit cell 450 is improved. Also, by having the port elements on first conductive layer 102 or 202 and the latch elements on second conductive layer 104 and 204, power routing and signal routing is separated between the two layers. For example, in some embodiments, a power supply for SRAM array can be routed within second conductive layer 104 or 204 for the PU or PD transistor devices, and signals (WL and BL) can be routed within first conductive layer 102 or 202 for the PG transistor devices.

Embodiments of the three dimensional dual-port bit cell described herein has a configuration and design that facilitates a reduction in footprint area while improving overall cell performance and inhibiting signal routing complexities for the corresponding static random access memories ("SRAM") array that the cell is used with. For example, in some embodiments, the three-dimensional dual-port cell is configured such that port elements or components are disposed on a top conductive layer and latch elements or components are disposed on a bottom conductive layer. Not only does this configuration facilitate a footprint area reduction, but word line (WL) parasitic resistance and capacitance is also reduced, thereby improving the overall performance of the cell. Also, by having the port elements on the top conductive layer and the latch elements on the bottom conductive layer, power routing and signal routing is separated between the two layers. Because the power and signal routings are separated, signal routing complexities, such as signal blocks or jams, can be inhibited.

In some embodiments, a three dimensional dual-port bit cell includes a first portion disposed on a first tier, wherein the first portion includes a plurality of port elements. The dual-port bit cell also includes a second portion disposed on a second tier that is vertically stacked with respect to the first tier using at least one via, wherein the second portion includes a latch.

In some embodiments, a semi-conductor memory includes a first tier that includes an access port array portion. The semi-conductor memory includes a second tier vertically stacked with respect to the first tier using at least one via, wherein the second tier includes a latch array portion. The semi-conductor memory also includes at least one three dimensional dual-port bit cell that includes a first portion disposed on the access port array portion, wherein the first portion includes a plurality of port elements. The dual-port bit cell also includes a second portion disposed on the latch array portion, wherein the second portion includes a latch.

In some embodiments, a method of using a three dimensional dual-port bit cell includes disposing a first portion of the three dimensional dual-port bit cell onto a first tier, wherein the first portion includes a plurality of port elements. A second portion of the three dimensional dual-port bit cell is disposed onto a second tier that is vertically stacked with respect to the first tier using at least one via, wherein the second portion includes a latch.

Although the invention has been described in terms of exemplary embodiments, it is not limited thereto. Rather, the appended claims should be construed broadly,to include other variants and embodiments of the invention, which may be made by those skilled in the art without departing from the scope and range of equivalents of the invention.

What is claimed is:

1. A three dimensional dual-port bit cell comprising:
   a first portion disposed on a first tier, wherein said first portion comprises a plurality of port elements; and
   a second portion disposed on a second tier that is vertically stacked with respect to the first tier using at least one via, wherein said second portion comprises a latch,
   wherein said first tier further comprises a first control circuit and a first write driver of a first port.

2. The three-dimensional dual-port bit cell of claim 1, further comprising a plurality of bit lines that extend in a first direction in a conductive layer of the first tier, and a plurality of word lines that each extend in a second direction in a second conductive layer of the first tier, the first direction being different from the second direction.

3. The three-dimensional dual-port bit cell of claim 1, wherein said port elements comprise at least a first pass-gate device and at least a second pass-gate device, said latch comprising at least one pull-up device and at least a first pull-down device, and at least a second pull-down device.

4. The three dimensional dual-port bit cell of claim 3, wherein said first and second pass-gate devices and said first and second pull-down devices are each NMOS devices.

5. The three dimensional dual-port bit cell of claim 3, wherein said at least one pull-up device is a PMOS device.

6. The three dimensional dual-port bit cell of claim 3, wherein said latch further comprises at least a third pull-down device.

7. The three dimensional dual-port bit cell of claim 6, wherein said port elements further comprise at least a third pass-gate device and said latch further comprises at least a fourth pull-down device.

8. The three dimensional dual-port bit cell of claim 7, wherein said latch further comprises at least a fifth pull-down device.

9. A semi-conductor memory comprising:
   a first tier comprising an access port array portion;
   a second tier vertically stacked with respect to said first tier using at least one via, wherein said second tier comprises a latch array portion; and
   at least one three dimensional dual-port bit cell comprising:

a first portion disposed on said access port array portion, wherein said first portion comprises a plurality of port elements; and a second portion disposed on said latch array portion, wherein said second portion comprises a latch;

wherein said first tier further comprises a first control circuit and a first write driver of a first port.

10. The semi-conductor memory of claim 9, further comprising a plurality of bit lines that extend in a first direction in a conductive layer of the first tier, and a plurality of word lines that each extend in a second direction in a second conductive layer of the first tier, the first direction being different from the second direction.

11. The semi-conductor memory of claim 10, wherein said port elements comprise at least a first pass-gate device and at least a second pass-gate device, said latch comprising at least one pull-up device and at least a first pull-down device, and at least a second pull-down device.

12. The semi-conductor memory of claim 10, wherein said first and second pass-gate devices and said first and second pull-down devices are each NMOS devices.

13. The semi-conductor memory of claim 10, wherein said at least one pull-up device is a PMOS device.

14. The semi-conductor memory of claim 10, wherein said latch further comprises at least a third pull-down device.

15. The semi-conductor memory of claim 14, wherein said port elements further comprise at least a third pass-gate device and said latch further comprises at least a fourth pull-down device.

16. The semi-conductor memory of claim 9, wherein said second tier further comprises a second control circuit and a second write driver of a second port.

17. A method, said method comprising:

disposing a first portion of the three dimensional dual-port bit cell onto a first tier, wherein the first portion includes a plurality of port elements; and disposing a second portion of the three dimensional dual-port bit cell onto a second tier that is vertically stacked with respect to the first tier, wherein the second portion includes a latch, wherein said first tier further comprises a first control circuit and a first write driver of a first port.

18. The method of claim 17, wherein the wherein the plurality of port elements include at least a first pass-gate device and at least a second pass-gate device and wherein the latch includes at least one pull-up device and at least a first pull-down device, and at least a second pull-down device.

19. The method of claim 18, further comprising:

routing signals within the first tier for the first and the second pass-gate devices; and routing a power supply within the second tier for the pull-up device and the pull-down devices.

* * * * *